(12) United States Patent
Azary

(10) Patent No.: US 9,025,648 B2
(45) Date of Patent: May 5, 2015

(54) MEASUREMENT OF DC OFFSETS IN IQ MODULATORS

(71) Applicant: Tektronix, Inc., Beaverton, OR (US)

(72) Inventor: Zoltan Azary, Santa Rosa, CA (US)

(73) Assignee: Tektronix, Inc., Beaverton, OR (US)

( * ) Notice: Subject to any disclaimer, the term of this patent is extended or adjusted under 35 U.S.C. 154(b) by 81 days.

(21) Appl. No.: 13/774,565

(22) Filed: Feb. 22, 2013

(65) Prior Publication Data

US 2014/0241407 A1    Aug. 28, 2014

(51) Int. Cl.
*H04B 3/46* (2006.01)
*H04B 17/00* (2006.01)
*H03C 3/40* (2006.01)
*H04L 27/36* (2006.01)

(52) U.S. Cl.
CPC .............. *H04B 17/0037* (2013.01); *H03C 3/40* (2013.01); *H04L 27/364* (2013.01)

(58) Field of Classification Search
CPC ..................... H04L 27/364; H04L 2027/0016; H04L 2027/0018
USPC .................................................. 375/224, 296
See application file for complete search history.

(56) References Cited

U.S. PATENT DOCUMENTS 6,298,096 B1 * 10/2001 Burgin ............................ 375/296
6,801,581 B1   10/2004 Francos et al.
2002/0191713 A1 * 12/2002 McVey ............................ 375/308
2008/0090531 A1 *  4/2008 Jungerman et al. ............. 455/126
2008/0160935 A1    7/2008 Rexberg
2009/0233562 A1    9/2009 Kim et al.
2009/0315746 A1 * 12/2009 Nitsche ........................... 341/120
2013/0128931 A1 *  5/2013 Lin et al. ......................... 375/219

FOREIGN PATENT DOCUMENTS

EP         1478097 A1    11/2004

OTHER PUBLICATIONS

European Search Report from EP No. 14156198.5, dated May 26, 2014, 6 pages.

* cited by examiner

*Primary Examiner* — Shuwang Liu
*Assistant Examiner* — David S Huang
(74) *Attorney, Agent, or Firm* — Marger Johnson & McCollom PC

(57) ABSTRACT

Described are systems and methods of determining DC offset voltages in IQ modulators. First, two different DC test voltages are selected for one of the inputs to the IQ modulator. Then, a first test voltage is applied to one input to the IQ modulator while test data is generated by measuring outputs from a set of signals applied to the other input to the IQ modulator. Then the second test voltage is applied and another set of test data generated. From the first and second sets of test data, second-order polynomial functions may be constructed and compared to one another to yield a ratio of power value outputs. Then the DC offset voltages may be determined from the ratio of power value outputs.

16 Claims, 4 Drawing Sheets

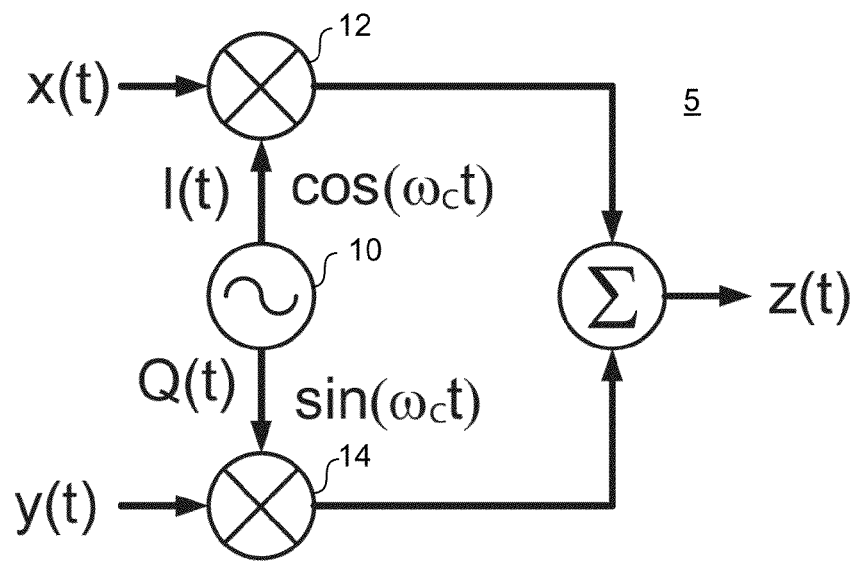
FIGURE 1
(Conventional)
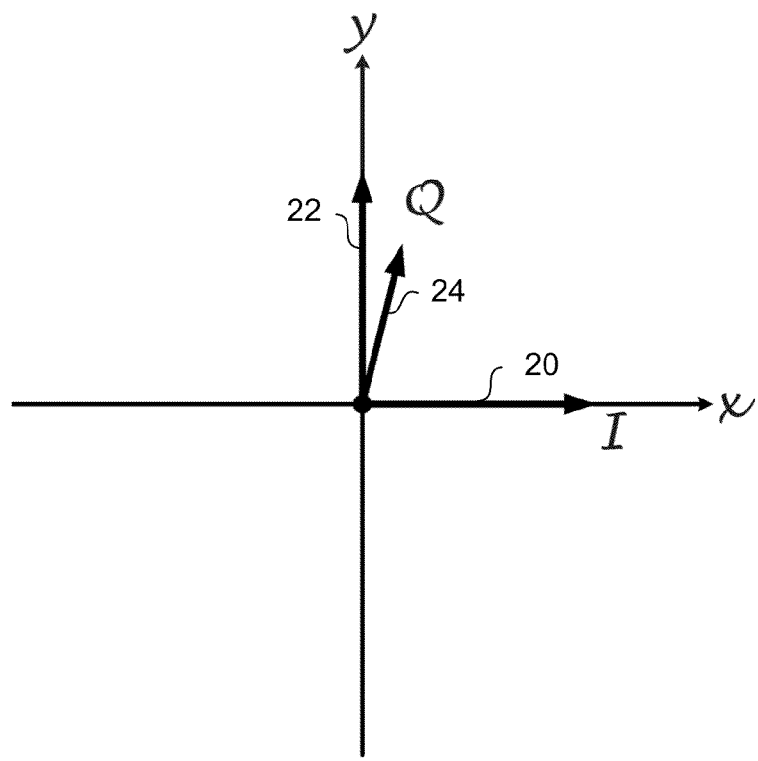
FIGURE 2
(Conventional)

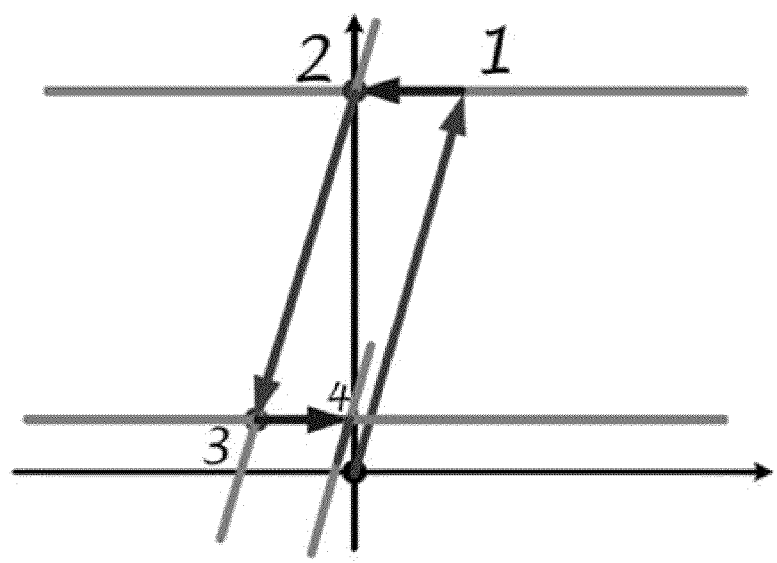
FIGURE 3
(Conventional)

MEASUREMENT OF DC OFFSETS IN IQ MODULATORS

FIELD OF THE INVENTION

This disclosure is directed to systems and methods for measuring parameters in IQ modulators, and, more particularly, to systems and methods of measuring offset voltages commonly called DC offsets in IQ modulators.

BACKGROUND

IQ modulators are well known in the field of RF and microwave communications, finding use in both analog and digital modulation formats. IQ modulation is a method of modulating a carrier wave, which is typically but not always sinusoidal, with two baseband input signals. The two signals are oftentimes referred to as I (in-channel) and Q (quadrature-phase) components.

FIG. 1 is a block diagram of an example conventional I-Q modulator 5. It contains a local oscillator (or "LO") 10 producing sinusoidal signals at a carrier frequency, designated as $\omega_c$. The LO 10 has two outputs, which are of equal magnitude and differ in phase by exactly 90 degrees. The signal from the LO 10 are multiplied in mixers 12, 14 by two independent baseband inputs, the I and Q inputs. These products of the I and Q inputs and the carrier frequency $\omega_c$ are summed to yield the frequency-converted result. Baseband inputs may contain any arbitrary waveforms, although the bandwidth of these is usually less than the carrier frequency.

In FIG. 1, the baseband inputs are designated as x (in-phase) and y (quadrature), while the two LO signals are designated I and Q. When represented using phasor notation at the carrier frequency, the two LO signals are simply:

$$I=e^{j0}=1, Q=e^{j\pi/2}=j$$

The output of the modulator 5 is the sum of these two quadrature LO signals I and Q multiplied by the two baseband modulation inputs (represented by {x,y}):

$$z=xI+yQ=x+jy$$

In this way, the I-Q modulator 5 up-converts the real-valued baseband inputs {x, y} as if taken together, they were together a complex-valued input (x+jy).

FIG. 2 is a phasor diagram showing an ideal I vector 20 and an ideal Q vector 22. Although ideal modulators will generate I and Q channels that have exactly the same amplitude gain across the desired frequencies, and will be out of phase from one another by exactly 90 degrees, real-world implementations of the I and Q signals do not have identical magnitudes and do not differ in phase by exactly 90 degrees. Additional non-ideal aspects of the I-Q modulator, such as differing gains and phases between the two mixers, can also be modeled as amplitude and phase imbalances between the I and Q LO signals. These imbalances may affect the quality of the generated signal from the modulator.

Without loss of generality, the I vector can be arbitrarily defined to be one, and then the Q vector may be restated as:

$$Q=(1+\epsilon)e^{j[\pi/2+\gamma]},$$

where $\epsilon$ and $\gamma$ represent errors in magnitude and phase respectively. This error itself may be represented in the phasor diagram. For example, in FIG. 2, this errant Q vector is depicted by the vector 24. Such errors are also referred to as "IQ imbalance," and often vary with changes in operating parameters, such as carrier frequency and drive power of the local oscillator 10.

Imperfections in the design and construction of IQ modulators result in apparent DC offsets being present at the {x, y} inputs. This causes problems with the modulated signal at exactly the carrier frequency. Often it is desirable to remove the signal component at the carrier frequency. To achieve this result in a modulated signal, the analog waveforms presented at the {x, y} inputs would normally be designed to have a zero average DC level. Unfortunately, DC offsets in the modulator result in an undesired signal component at the carrier frequency under these conditions.

It is therefore important to adjust the analog input waveforms' average DC level to compensate for internal offsets in the IQ modulator, thus removing the carrier component from the modulated signal. Similar problems occur when a component with specific magnitude and phase must be intentionally generated at the carrier frequency.

It is not possible to remove the carrier component from the IQ modulator output without determining the DC offset, which must first be measured. One conventional method for measuring DC offset is illustrated in FIG. 3. In a typical method, the DC average of the x input is adjusted to minimize the carrier signal amplitude. Generally this will not reduce the carrier amplitude to zero because of the unknown DC offset present at the y input of the modulator. Thus, the standard way to measure offset becomes an iterative process, where first DC average of the x input is first adjusted, then the y input is adjusted. Adjusting the y input, however, affects the x offset, so then the x input is adjusted again, followed by the y input being adjusted again. Each iteration typically reduces the amount of adjustment made in subsequent iterations until finally the carrier amplitude is driven to acceptably low levels. An additional complication is that the variation of carrier power versus DC offset is not linear, and present techniques use various iterative search techniques to locate an offset that minimizes carrier power. FIG. 3 illustrates only the first four iterations, but in practice the final DC measurement may involve many iterations.

As may be imagined from the above description, conventional measurement techniques for measuring DC offset such as the iterative technique described above suffer from deficiencies such as being tedious and time consuming to measure. Thus conventional DC offset testing methods are inaccurate, take too long, or both.

Embodiments of the invention address these and other limitations of the prior art.

SUMMARY OF THE INVENTION

Aspects of the invention include a method of determining a DC offset in an IQ modulator, including selecting a first and a second voltage for a first input to an IQ modulator, such as the Q input. Then, for each of the first and second voltages applied to the Q input, applying a set of input signals to a second input of the IQ modulator, such as the I input, and generating a respective set of measured parameters from an output of the IQ modulator. In some embodiments generating the measured parameters may include determining carrier power. Next, the method may include generating a first, second-order polynomial function from the set of measured parameters related to the first voltage of the first input of the IQ modulator as well as generating a second, second-order polynomial function from the set of measured parameters related to the second voltage of the first input of the IQ modulator. In some embodiments the second-order polynomial function may be a parabola. Then factors of the first and second functions may be compared to determine a relationship of the first and second functions to one another, and the DC offset determined from the determined relationship of the functions.

Other aspects may include device for determining a DC offset in an IQ modulator. Such a device may include a first input, such as a Q input, to an IQ modulator at which a first and a second voltage may be accepted and a second input to the IQ modulator at which, for each of the first and second voltage, a set of input signals may be applied. The second input may be the I input and may include, for example, three or mor signals. A detector is structured to generate a respective set of measured parameters from an output of the IQ modulator for each of the set of input signals, and a function generator is structured to generate polynomial functions from the measured parameters, such as a parabola. Once the functions are generated, a comparator can be used to compare factors of the generated polynomial functions, such as a power level, to one another to generate a relationship between the measured parameters. Then an offset calculator can determine the DC offset from the determined relationship.

BRIEF DESCRIPTION OF THE DRAWINGS

FIG. 1 is a block diagram of an example conventional I-Q modulator.

FIG. 2 is a phasor diagram illustrating example IQ imbalance of a conventional I-Q modulator.

FIG. 3 illustrates an iterative offset measuring technique according to the prior art.

DETAILED DESCRIPTION

This disclosure generally considers the use of IQ modulators in signal generation systems, not receiving equipment, although embodiments of the invention are also applicable to receivers. As such, it is assumed that the baseband signals are input signals, and not output signals as would be the case with receiving equipment.

Embodiments of the invention are directed to systems and methods for determining DC offset that are non-iterative and can work with as few as six measurements. A mathematical framework will aid in understanding the algorithm. The I vector resulting from the application of some DC level at the in-phase input to the modulator can be defined as:

$$(v_I + \epsilon_I)I = \alpha I$$

Here, $v_I$ is the purposely applied voltage, while $\epsilon_I$ is the DC offset. These factors can be combined as shown above, with $\alpha$ as the actual magnitude of the I vector, being the result of the average DC input voltage plus some unknown offset. The same goes for Q:

$$(v_Q + \epsilon_Q)Q = \beta Q$$

The carrier output power is proportional to the magnitude-squared of the vector sum of I and Q. This can represented as below.

$$P(\alpha, \beta) = |\alpha I + \beta Q|^2 \quad (1)$$

For clarity, a constant multiplier that is sometimes used to yield power in particular units is omitted. Furthermore, any difference in magnitude between the local oscillator's I and Q signals has been ignored, since the algorithm is insensitive to any such difference, as described below.

Figure 4:
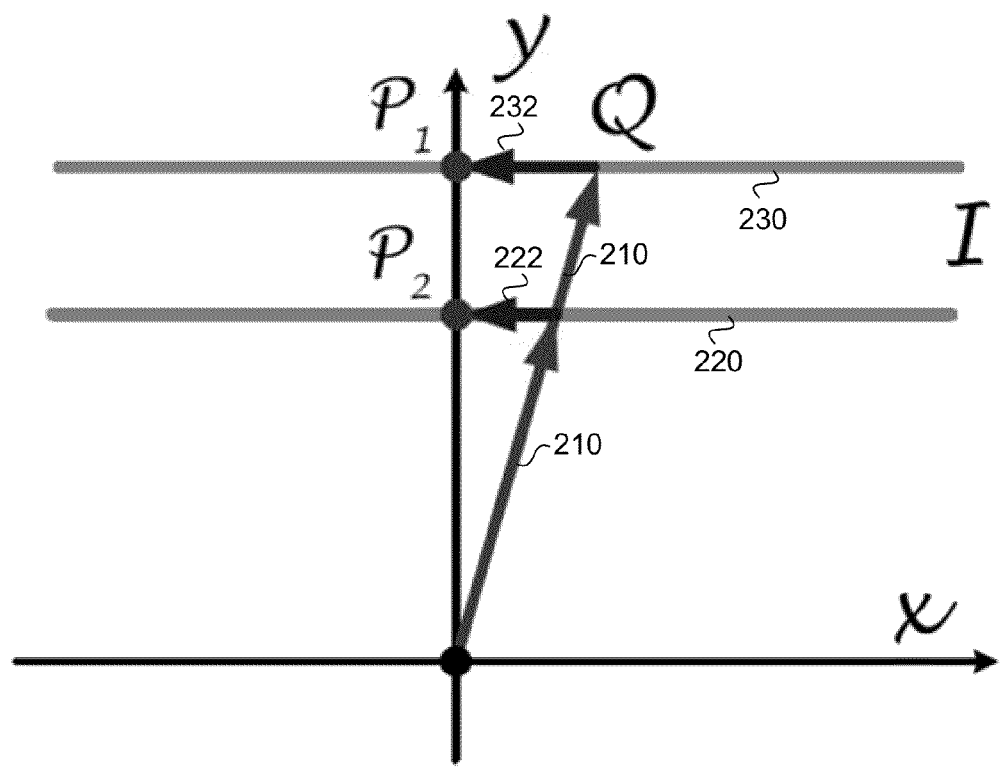
FIG. 4 illustrates an offset measuring technique according to embodiments of the invention.

FIG. 4 graphically illustrates a vector summation. Two different lengths of the Q vector are illustrated as reference 210. In each case, a one-dimensional sub-space accessible by altering the I vector magnitude is shown as the lines 220, 230. For each sub-space, the I vector 222, 232, respectively, when added to the corresponding Q vector, minimizes the length of the resultant vector. This corresponds to the minimum possible carrier amplitude for each of the two Q vectors. These points are labeled P1 and P2 in FIG. 4.

Of course, the problem is that the lengths of the I and Q vectors in FIG. 4 are equal to $\alpha$ and $\beta$ respectively in the above equations. Since the DC offsets $\{\epsilon_I, \epsilon_Q\}$ are unknown, it is only possible to change the vectors' lengths by controlled amounts.

For any fixed value of $\alpha$ or $\beta$ in Equation (1), the power function P(*) is quadratic in the other variable, and also therefore in the input voltage, vI or vQ. This observation allows a new method for determining the points P1, P2 in FIG. 4.

Initially, keep $v_Q$ (and therefore $\beta$) fixed, under the assumption that the DC offset $\epsilon_Q$ is also fixed, at least for the duration while embodiments of the invention determine the DC offset. Now, determine the value of $v_I$ for which carrier power is minimum; call this point $\{v_{I1}, v_{Q1}, P_1\}$. Because the relationship between $v_I$ and P is known to be quadratic under these conditions, P can be measured for three different values of $v_I$ and a second order polynomial fit to the data points. Once the polynomial coefficients are known, the minimum point is easily calculated or determined.

Then, change $v_Q$ to a different value and repeat the above steps, which will result in a new minimum point, $\{v_{I2}, v_{Q2}, P_2\}$. An example of these two points is shown in FIG. 4. Notice that two similar triangles are formed by the experiments. In some cases, the second experiment may result in the Q vector reversing direction, but the resulting triangles are still similar.

Due to the trigonometric similarity of these two points, the ratio in carrier voltages (designated as r below) will be equal to the ratio of the two (unknown) Q vector magnitudes:

$$r \equiv \sqrt{\frac{P_2}{P_1}} = \left|\frac{\beta_2}{\beta_1}\right| = \left|\frac{v_{Q2} + \epsilon_Q}{v_{Q1} + \epsilon_Q}\right|$$

In the above equation, P1, P2, $v_{Q1}$, $v_{Q2}$ are all known values so the only unknown is the offset voltage, EQ, which is determined by the following:

$$r(v_{Q1} + \epsilon_Q) = \pm v_{Q2} \pm \epsilon_Q \quad (2)$$

$$rv_{Q1} + r\epsilon_Q = \pm v_{Q2} + \epsilon_Q$$

$$\epsilon_Q(r \mp 1) = \pm v_{Q2} - rv_{Q1}$$

$$\epsilon_Q = \frac{\pm v_{Q2} - rv_{Q1}}{r \mp 1}$$

For clarity in earlier equations, a constant multiplier between the DC offsets and actual carrier power was ignored. The fact that power is being ratioed in the above equation effectively cancels that multiplier and removes it from consideration.

Due to the same geometric similarity, the amount by which the actual I vector magnitude changed between the two points also equals the carrier voltage ratio:

$$r = \left|\frac{\alpha_2}{\alpha_1}\right| = \left|\frac{v_{I2}+\epsilon_I}{v_{I1}+\epsilon_I}\right| \quad (3)$$

$$\epsilon_I = \frac{\pm v_{I2} - rv_{I1}}{r \mp 1}$$

Also for clarity, the above explanation ignores any difference in magnitude between the I and Q vectors. Since the inventive method concerns ratios between power levels and I, any such differences with Q vector magnitudes are insignificant.

There are in fact four possible solutions to the problem due to the absolute value operators present in the above equations. In the worst case, four more measurements or tests are made to determine which of the answers to select as the most useful answer. In reality, the most correct answer may oftentimes be guessed from the answers to the equations, confirmed by a single measurement.

There are certain conditions where answers generated by embodiments of the invention are recognizable as non-sensical. For instance, if one of the measurement powers happens to be zero, the output from the equations may be undefined; however in this case the exact DC offsets have been accidentally discovered so there is not any real problem.

Another problem may occurs when:

$$v_{Q1}+\epsilon_Q = -(v_{Q2}+\epsilon_Q)$$

In this case r=1 and the denominator of the equation becomes zero. In this case, the offset voltage $\epsilon_Q$ can still be readily determined:

$$\epsilon_Q = -\frac{v_{Q1}+v_{Q2}}{2} \quad (4)$$

Figure 5:
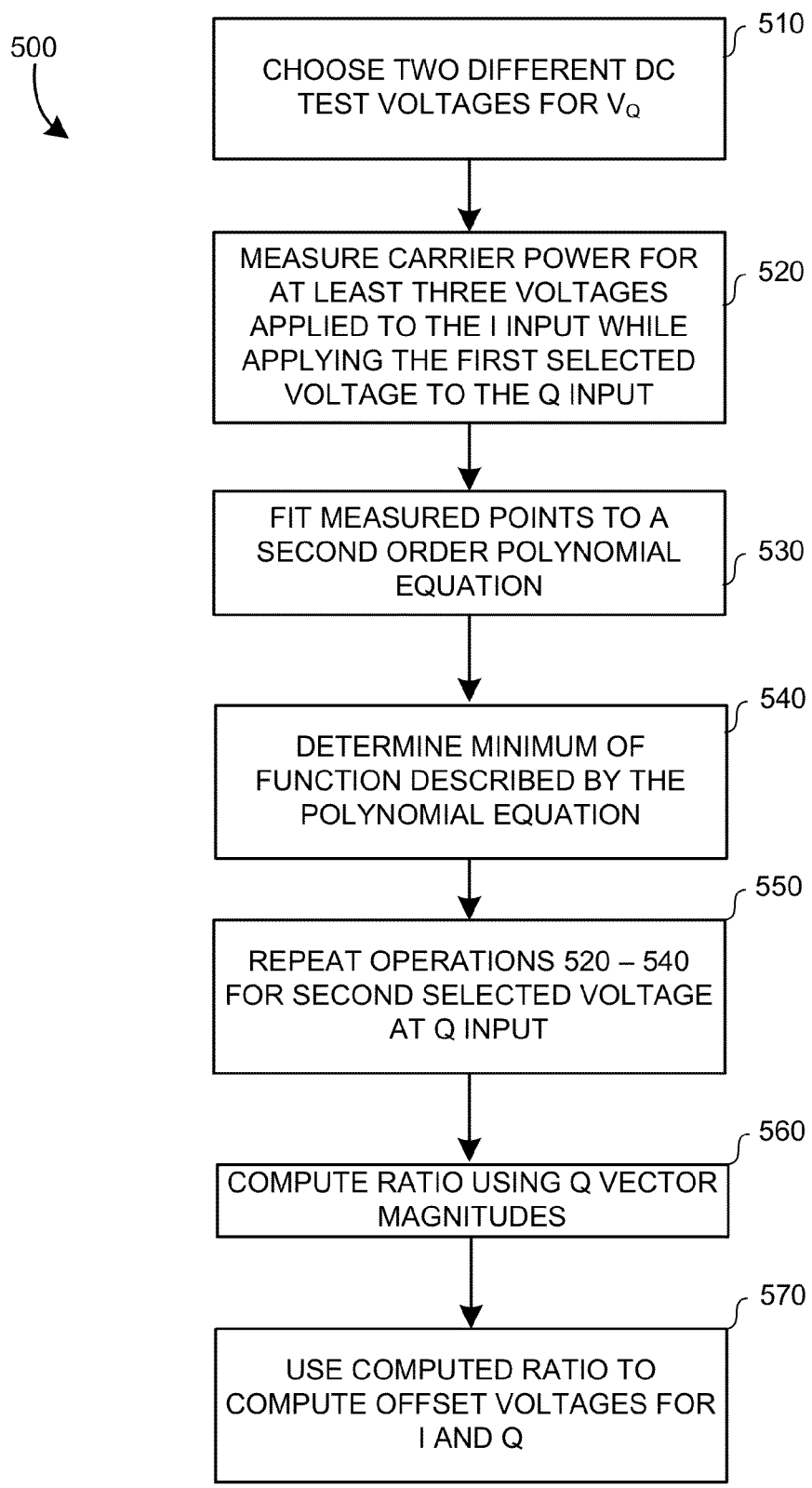
FIG. 5 is a flow diagram illustrating example methods of determining DC offsets in IQ modulators according to embodiments of the invention.

FIG. 5 is a flow diagram illustrating an example method according to embodiments of the invention. A flow 500 begins at an operation 510 where two different DC test voltages for $v_Q$ are chosen. In a preferred embodiment, the selected voltages differ by approximately the expected DC offset value, and are also large enough to produce a measurable carrier amplitude.

In an operation 520, the first selected test voltage is applied to the Q input and the carrier power measured with at least three different DC voltages applied to the I input. In a preferred embodiment more than three measurements may be made, especially when system noise or measurement resolution is a consideration. Again, for numerical accuracy, it is also better that these voltages differ by amounts as described with reference to operation 510 above.

In an operation 530, the measured points are fit to a second order polynomial equation, then, an operation 540 determines the minimum point of the polynomial function. This is {$v_{I1}$, $v_{Q1}$, $P_1$}.

In an operation 550, the operations 520, 530, and 540 are repeated for the second Q test voltage to get {$v_{I1}$, $v_{Q2}$, $P_2$}. In a preferred embodiment the three I test voltages may be shifted to straddle the point $v_{I1}$.

In an operation 560, r is computed using the following equation for the two Q vector magnitudes:

$$r = \sqrt{\frac{P_2}{P_1}}$$

Then, in an operation 570, the r value computed in the operation 560 is used to compute the DC offsets $\epsilon_Q$ and $\epsilon_I$ using equations 2 and 3, respectively.

After the DC offsets are computed, special cases may be evaluated. For example, if r computed in the operation 560 is close to one, then the second test voltages for 1 may be changed and the process run again. also, if $v_{I1}$ and $v_{I2}$ are nearly identical, then $\epsilon_I$ is approximately equal to their average. Further, if one of the carrier powers is zero, then the exact DC offsets were initially selected and no further calculations are necessary.

Particularly, an exemplary embodiment of the invention may include a method of determining a DC offset in an IQ modulator, including selecting a first and a second voltage for a first input to an IQ modulator, such as the Q input. Then, for each of the first and second voltages applied to the Q input, applying a set of input signals to a second input of the IQ modulator, such as the I input, and generating a respective set of measured parameters from an output of the IQ modulator. In some embodiments generating the measured parameters may include determining carrier power. Next, the method may include generating a first, second-order polynomial function from the set of measured parameters related to the first voltage of the first input of the IQ modulator as well as generating a second, second-order polynomial function from the set of measured parameters related to the second voltage of the first input of the IQ modulator. In some embodiments the second-order polynomial function may be a parabola. Then factors of the first and second functions may be compared to determine a relationship of the first and second functions to one another, and the DC offset determined from the determined relationship of the functions.

The method may further include, for instance, determining a minimum of the first and second-order polynomial function and determining a power level from the minimum of the first and second-order polynomial functions.

It is be obvious that embodiments of the invention could also be performed by swapping x and y inputs, with obvious changes in the math.

Figure 6:
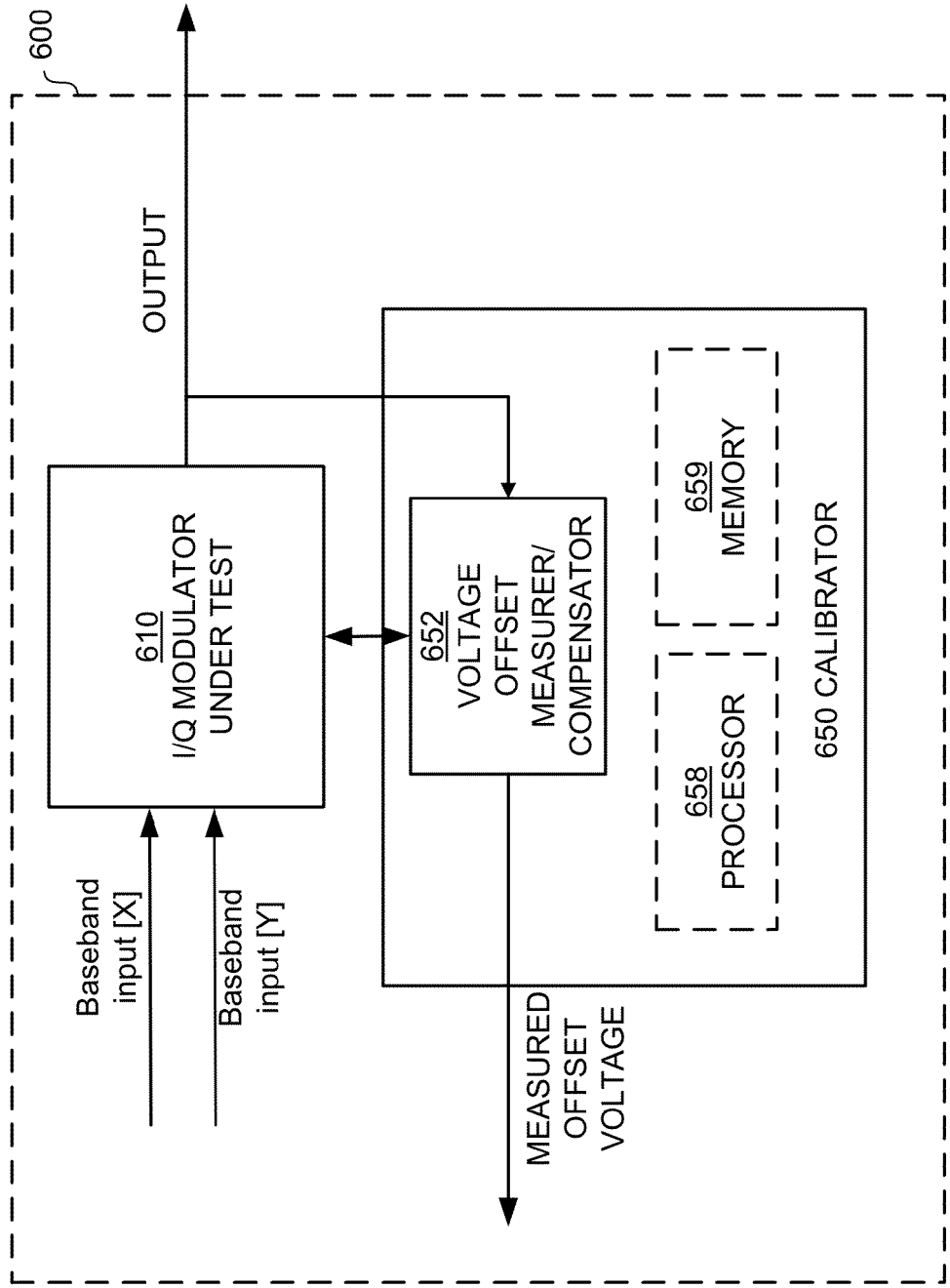
FIG. 6 is a functional block diagram illustrating components of a device for determining DC offset of IQ modulators according to embodiments of the invention.

FIG. 6 is a functional block diagram of a component 600 that includes a voltage offset measurer 652. The offset measurer 652 may also be combined with compensation circuitry so that an IQ modulator 610 the component 600 may be self-calibrated. In other words, the offset measurer may measure the DC offset of the IQ modulator 610 using the techniques described above and then compensate the modulator 610 by the measured amount to make the IQ modulator most efficient.

In other embodiments the offset measurer 652 may be in another instrument (not shown) coupled to the component 600 and used to measure or compensate for DC offset in the IQ modulator 610. In yet other embodiments the offset measurer may be embodied in software stored in a memory 659 or other computer readable medium that may be executed by a processor 658 to produce the DC measurements or compensation.

In a particular embodiment, a device for determining a DC offset in an IQ modulator, the device includes a first input, such as a Q input, to an IQ modulator at which a first and a second voltage may be accepted and a second input to the IQ modulator at which, for each of the first and second voltage, a set of input signals may be applied. The second input may be the I input and may include, for example, three or mor signals. A detector is structured to generate a respective set of measured parameters from an output of the IQ modulator for each of the set of input signals, and a function generator is structured to generate polynomial functions from the measured parameters, such as a parabola. Once the functions are generated, a comparator can be used to compare factors of the generated polynomial functions, such as a power level, to one another to generate a relationship between the measured parameters. Then an offset calculator can determine the DC offset from the determined relationship.

Embodiments may also include a minimum detector structured to detect a minimum of the generated polynomial functions, as well as a power detector structured to determine a power level from the minimum of the polynomial functions.

The device may be embodied in an instrument, and further, may be included in a self-calibration circuit to the instrument itself.

Having described and illustrated the principles of the invention with reference to illustrated embodiments, it will be recognized that the illustrated embodiments may be modified in arrangement and detail without departing from such principles, and may be combined in any desired manner. And although the foregoing discussion has focused on particular embodiments, other configurations are contemplated.

In particular, even though expressions such as "according to an embodiment of the invention" or the like are used herein, these phrases are meant to generally reference embodiment possibilities, and are not intended to limit the invention to particular embodiment configurations. As used herein, these terms may reference the same or different embodiments that are combinable into other embodiments.

Consequently, in view of the wide variety of permutations to the embodiments described herein, this detailed description and accompanying material is intended to be illustrative only, and should not be taken as limiting the scope of the invention. What is claimed as the invention, therefore, is all such modifications as may come within the scope and spirit of the following claims and equivalents thereto.

What is claimed is:

1. A method of determining a DC offset in an IQ modulator, the method comprising:
    selecting a first and a second voltage for a first input to the IQ modulator;
    for each of the first and second voltages:
        applying a set of input signals to a second input of the IQ modulator and generating a respective set of measured parameters from an output of the IQ modulator;
    generating a first, second-order polynomial function from the set of measured parameters related to the first voltage of the first input of the IQ modulator;
    generating a second, second-order polynomial function from the set of measured parameters related to the second voltage of the first input of the IQ modulator;
    comparing factors of the first and second functions to determine a relationship of the first and second second-order polynomial functions to one another; and
    determining the DC offset from the determined relationship of the functions.

2. The method of determining a DC offset in the IQ modulator according to claim 1, further comprising:
    determining a minimum from the first second-order polynomial function and the second, second-order polynomial function.

3. The method of determining a DC offset in the IQ modulator according to claim 2, further comprising:
    determining a power level from the determined minimum.

4. The method of determining a DC offset in the IQ modulator according to claim 3 in which the determined relationship is a ratio of the power levels determined from the minimums of the first and second second-order polynomial functions.

5. The method of determining a DC offset in the IQ modulator according to claim 1 in which generating a respective set of measured parameters from an output of the IQ modulator comprises measuring carrier power of the IQ modulator while a voltage is applied to the first input.

6. The method of determining a DC offset in the IQ modulator according to claim 1 in which the first input is a Q input to the IQ modulator.

7. The method of determining a DC offset in the IQ modulator according to claim 1 in which generating a first, second-order polynomial function comprises generating a parabola function.

8. A device for determining a DC offset in an IQ modulator, the device comprising:
    a first input to the IQ modulator at which a first and a second voltage may be accepted;
    a second input to the IQ modulator at which, for each of the first and second voltages a set of input signals may be applied;
    a detector structured to generate a respective set of measured parameters from an output of the IQ modulator for each of the set of input signals;
    a function generator structured to generate polynomial functions from the measured parameters;
    a comparator structured to compare factors of the generated polynomial functions to one another to generate a relationship between the measured parameters; and
    an offset calculator structured to determine the DC offset from the determined relationship.

9. The device for determining a DC offset in the IQ modulator according to claim 8, further comprising:
    a minimum detector structured to detect a minimum of the generated polynomial functions.

10. The device for determining a DC offset in the IQ modulator according to claim 9, further comprising:
    a power detector structured to determine a power level from the minimum of the polynomial functions.

11. The device for determining a DC offset in the IQ modulator according to claim 10 in which the comparator is structured to determine a ratio of the power levels determined from the minimums of the polynomial functions.

12. The device for determining a DC offset in the IQ modulator according to claim 8 in which the first input is a Q input to the IQ modulator.

13. The device for determining a DC offset in the IQ modulator according to claim 8 in which the polynomial function is a parabola function.

14. The device for determining a DC offset in the IQ modulator according to claim 8 in which, for each of the first and second voltages applied to the first input, the set of input voltages applied to the second input includes at least three voltages.

15. The device for determining a DC offset in the IQ modulator according to claim 8 in which the device is embodied in a calibration circuit.

16. The device for determining a DC offset in the IQ modulator according to claim 15 in which the device is embodied in a self-calibration circuit of a measurement instrument.

* * * * *